United States Patent [19]
Rombach

[11] Patent Number: 6,154,089
[45] Date of Patent: Nov. 28, 2000

[54] FAST BUS DRIVER WITH REDUCED STANDBY POWER CONSUMPTION

[75] Inventor: Gerd Rombach, Freising, Germany

[73] Assignee: Texas Instruments Incorporated, Dallas, Tex.

[21] Appl. No.: 09/205,890

[22] Filed: Dec. 4, 1998

Related U.S. Application Data

[60] Provisional application No. 60/067,702, Dec. 5, 1997.

[51] Int. Cl.[7] .................................................. G05F 3/02
[52] U.S. Cl. ................................... 327/538; 327/539
[58] Field of Search ............................ 327/538, 539, 327/540, 541, 542, 543, 427, 432, 436, 478, 108; 326/84, 82

[56] References Cited

U.S. PATENT DOCUMENTS

| | | | |
|---|---|---|---|
| 5,149,988 | 9/1992 | Smith et al. ........................ | 307/296.6 |
| 5,852,383 | 12/1998 | Rombach .............................. | 327/538 |
| 6,018,265 | 1/2000 | Keshtbod .............................. | 327/540 |

FOREIGN PATENT DOCUMENTS

| | | | |
|---|---|---|---|
| 195 47 754 C1 | 12/1995 | Germany ...................... | H03K 17/06 |

*Primary Examiner*—Tuan T. Lam
*Assistant Examiner*—Linh Nguyen
*Attorney, Agent, or Firm*—W. Daniel Swayze, Jr.; Wade James Brady, III; Frederick J. Telecky, Jr.

[57] ABSTRACT

An integrated fast bus driver circuit with reduced standby power consumption for BiCMOS processes where the power consumption of the drive circuit corresponds to the output sink current. A feedback circuit is connected to detect voltage variations at the output terminal, and vary the base current of the output bipolar transistor to oppose the voltage variations.

6 Claims, 3 Drawing Sheets

FAST BUS DRIVER WITH REDUCED STANDBY POWER CONSUMPTION

This application claims priority under 35 USC § 119(e)(1) of provisional application number 60/067,702 filed Dec. 5, 1997.

BACKGROUND AND SUMMMARY OF THE INVENTION

The present invention relates to integrated bus drivers.
Background: Bus Interface Device Integrated bus interface devices must be capable of sinking or sourcing high output current when the output switches. A current in the range from 50–100 mA is typical. The high current is necessary to achieve fast propagation delay times (typically driving a 75-ohm transmission line). After the output has reached the stable steady state, only a small part of the switching current, or even no current is needed.

In BiCMOS chips, bipolar NPN transistors were traditionally used to deliver the high sink current that was needed for bus driver devices. However, while bipolar output drivers provide fast high-current output switching, they have the disadvantage of a large static power consumption.
Background: Power-On-Demand Technology In present day computer systems, the buses spend 80% or more of their time in the stable, inactive (low or high) state. Modern bus interface ICs take this into account. The circuits are designed for self-control of internal power consumption based upon what is needed to drive the output load. Power-On-Demand ("POD") circuits reduce power drain. The first circuits employing this feature appeared in 1992. However, a major limitation of these earlier designs is that the output clamping voltage is dependent on the output current. If current through the output transistor increases, the base-emitter voltage Vbe also increases, due in part to the emitter resistance of the output transistor. See Applicant's prior German application (#De 195 47 754 C1, Control Circuit for a BiCMOS Bus Driver), which is hereby incorporated by reference.
Fast Bus Driver with Reduced Standby Power Consumption The present application discloses an innovative technique for controlling power consumption in a BiCMOS bus driver circuit. A bipolar output driver is used with a MOS base drive circuit which includes a feedback relationship: as output current rises, the base current also rises. The base drive circuit reacts quickly to changes in the load impedance. The bipolar output driver still provides fast switching, and high peak current when needed, but the base drive circuit limits the static base current to a small value except when more is needed. The preferred feedback circuit configuration is nearly temperature and process compensated, and therefore easy to implement in different processes.

Thus the disclosed innovations reduce wasted power consumption. Moreover, the disclosed innovations can be used advantageously for all bus driver devices that are processed in BiCMOS technology. Another advantage is that the base current of the lower output transistor is controlled such that the output voltage stays constant regardless of how large or small the output sink current is. Another advantage is that the power consumption of the circuit is strongly related to the output sink current. Another advantage is that the technique works in the various power supply regimes of 2.5V, 3.3V, or 5.0V.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 1:
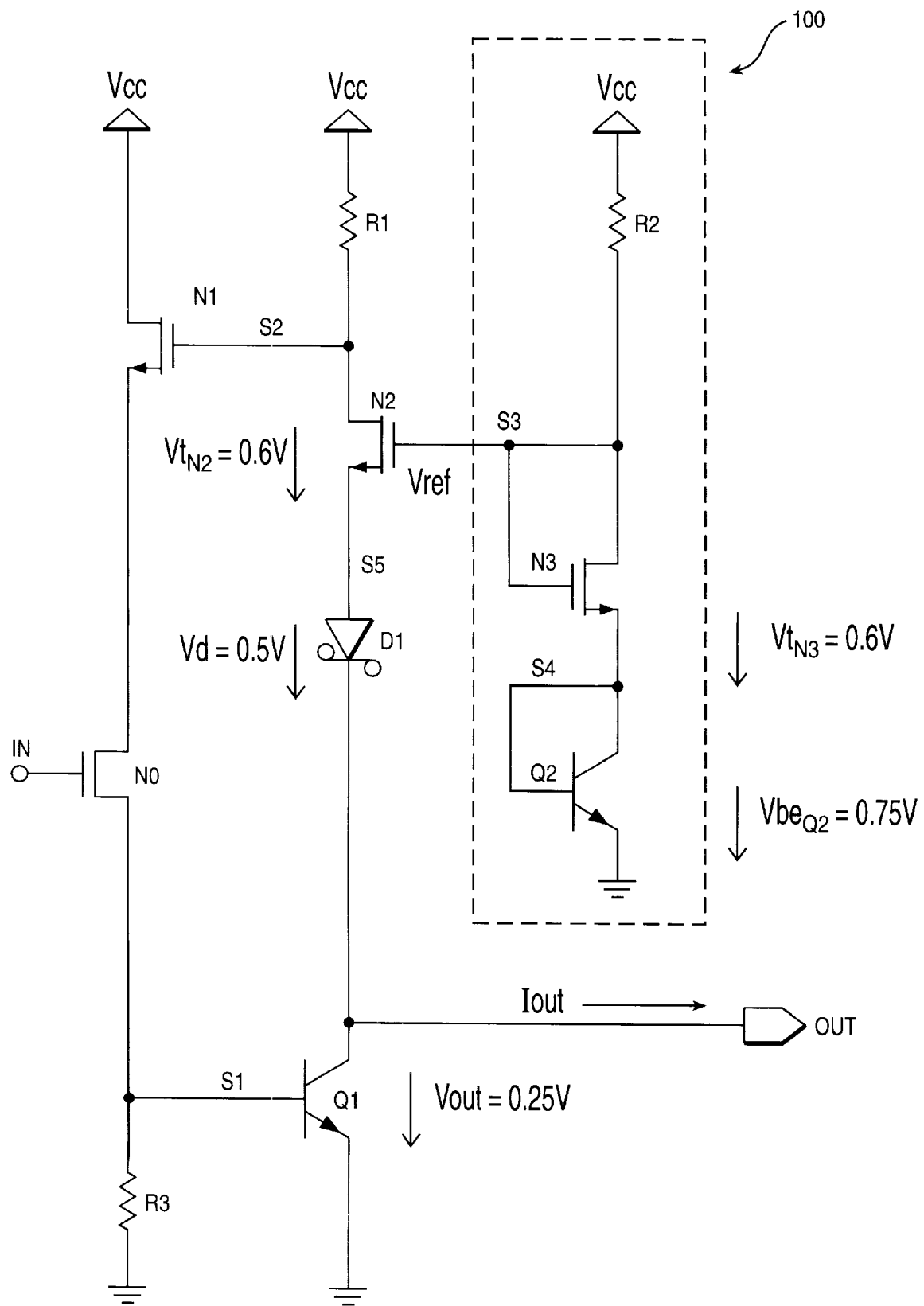
FIG. 1 shows a preferred embodiment of the circuit.
Figure 2:
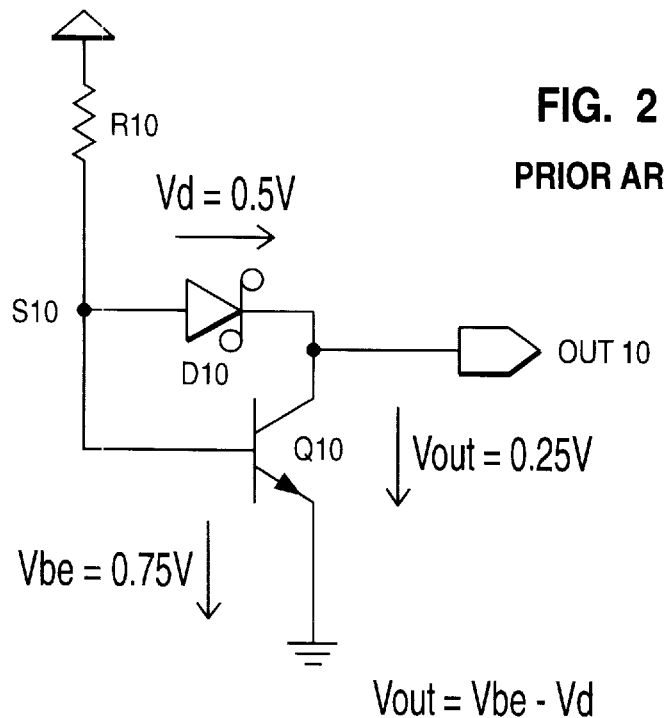
FIG. 2 shows a prior art circuit for the lower output transistor of a bus driver.
Figure 3:
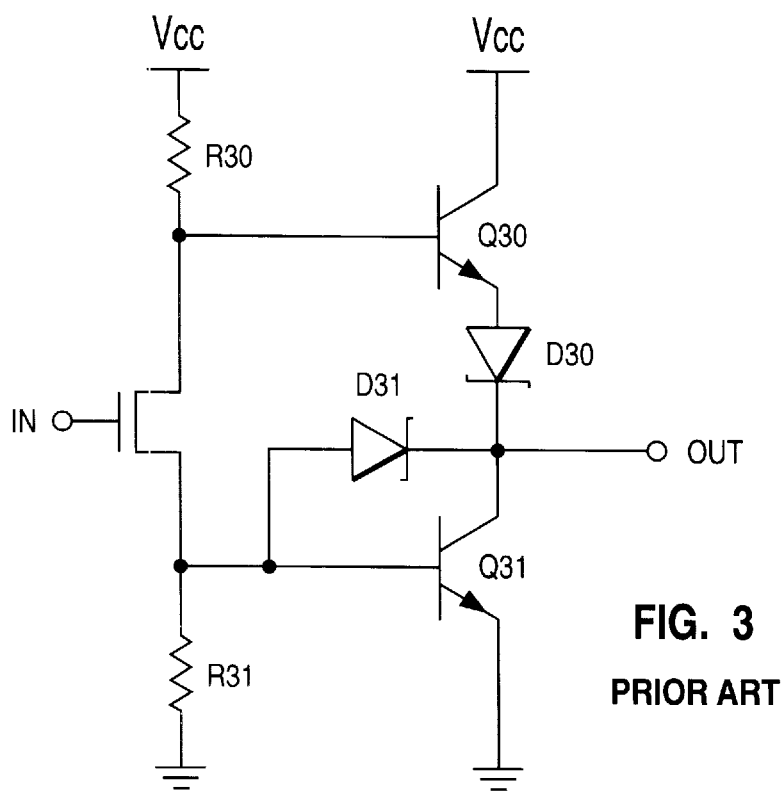
FIG. 3 shows a prior art driver circuit where base current is switch controlled to a fixed resistor value.

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.
Prior Art Bipolar Output Driver FIG. 2 shows the principle circuit for the lower output transistor of a bus driver. The clamping diode D10 is used to prevent the output transistor Q10 from saturating. The base current of Q10 is defined by the resistor value of R10. The resistor has to be designed small enough to guarantee a maximum value drive sink current at output OUT10. If the actual drive sink current is less than the maximum value, a part of the base current will flow through the clamping diode D10. Thus the current will not be available at the output, but be conducted through the diode and wasted.
Prior Art Simple Bus Output Driver FIG. 3 shows a prior art driver circuit where base current is switch controlled to a fixed resistor value. When the input IN is low, transistor Q31 is biased off since no base current exists. Transistor Q30 conducts based upon the base current developed from resistor R30. When the input IN is high, transistor Q31 is biased to conduct based upon the R30/R31 divider. In this case, most of the base current of the lower output transistor Q31 will sink through the clamping diode to ground. (The lower output transistor Q31 of a bus driver is usually clamped by a Schottky diode D31 to prevent the transistor from going into saturation.) This part of the current will be wasted at that time.
Innovative Power-On-Demand Circuit FIG. 1 shows a preferred embodiment of the circuit. NPN bipolar transistor Q1 is the output driver. The base current of Q1 is not set by a fixed resistor value, as is done in conventional circuits. Instead, the base current is controlled by the on-resistance of the NMOS transistors N1 and N0, and the resistance R3.

An output signal (from the internal circuits of the chip) is applied at terminal IN to the gate of transistor N0. When the signal at IN is high, the transistor Q1 is turned on to pull the OUT terminal low. This state is the one where the static power dissipation issues discussed above are most critical, and thus most of the following discussion will focus on this output state.

Transistor N1 is turned on or off by transistor N2. The state of transistor N2 depends upon the output voltage Vout, and is set by the network of transistors N2, N3, and Q2, and Schottky diode D1. When the output current Iout rises, the voltage across the collector-emitter of Q1 (Vout) will also rise, until the base current of transistor Q1 is regulated to a higher value.

Resistor R2, NMOS transistor N3, and bipolar transistor Q2, comprise a reference voltage circuit 100 which generates a reference voltage Vref at node s3. This reference voltage Vref is set by a NMOS transistor N3 threshold voltage $Vt_{N3}$, and a base-emitter voltage $Vbe_{Q2}$ of a bipolar NPN transistor Q2. Typical approximate voltage values for each are $Vt_{N3}=0.6V$ and $Vbe_{Q2}=0.75V$. The gate of NMOS transistor N2 is connected to the reference voltage circuit 100 at node s3. Transistor N2 becomes conducting if the voltage across transistor N2, diode D1, and the output voltage Vout, is less than the reference voltage Vref at node s3. Correspondingly, transistor N2 becomes less conducting as the output voltage rises, and turns off when its source voltage, plus its threshold voltage, becomes greater than the reference voltage.

When the voltage at the output OUT rises, transistor N2 turns off, voltage at node s2 rises, and transistor N1 conducts. When transistor N1 conducts, the base drive of transistor Q1 increases. (Both transistors N1 and N2 are biased weakly, such that transistor N1 is weakly on with low current demands at the output, and heavily on for high current demands at the output.) Transistor Q1 will turn on more, and the output voltage Vout will fall back to the initial value.

Since the threshold voltages (Vt, Vbe, and Vd) are fixed, and set by process parameters, the switching of transistor N2 depends only upon the output voltage Vout. The forward voltage Vd of the Schottky diode D1 is approximately 0.5V. The value of the output voltage Vout is approximately 0.25V, or essentially the difference between the voltage drop across the base-emitter of transistor Q2, and the forward voltage of the Schottky diode D1. That is, $Vout=(Vbe_{Q2}+Vt_{N3})-(Vd+Vt_{N2})$
$=(0.75+0.6)-(0.5+0.6)=0.25V$.

Typical devices sizes for a 0.6 micron process, and resistor values of 50K ohms for both R1 and R2, may be for example 50×60 square micrometers in a 500 ohm/square sheet resistance, for devices R1, and R2. Approximate transistor sizes are the following;
N1=40/0.6, N2=8/0.6, N3=8/0.6, Q1 emitter area=250×0.6 for 60 milliamps, Q2 emitter area=3×0.6, D1 Schottky area=30.

Key features of the innovative circuit are that the output voltage Vout is clamped, preventing the transistor Q1 from going into saturation. Another feature is that the base current of transistor Q1 is controlled so that the output voltage stays constant regardless of transistor Q1 collector current. Another feature is that the output voltage is nearly temperature compensated, since the temperature shift of the components in the control circuit cancel each other. The gate voltages of NMOS transistors N2 and N3 have the same temperature drift. Furthermore, the diode D1 forward voltage (Vd) temperature drift is compensated for by the base-emitter voltage drift of transistor Q2. Another feature is that the output voltage is partly process compensated—the influence of CMOS transistors N2 and N3 threshold voltages are cancelled out. Finally, the output clamping voltage is independent of the output current.

Note also that, in the presently preferred embodiment, the delay-limiting path of the feedback circuit includes only MOS transistors N1 and N2. Thus this feedback circuit can react quickly to load variations.

Figure 4:
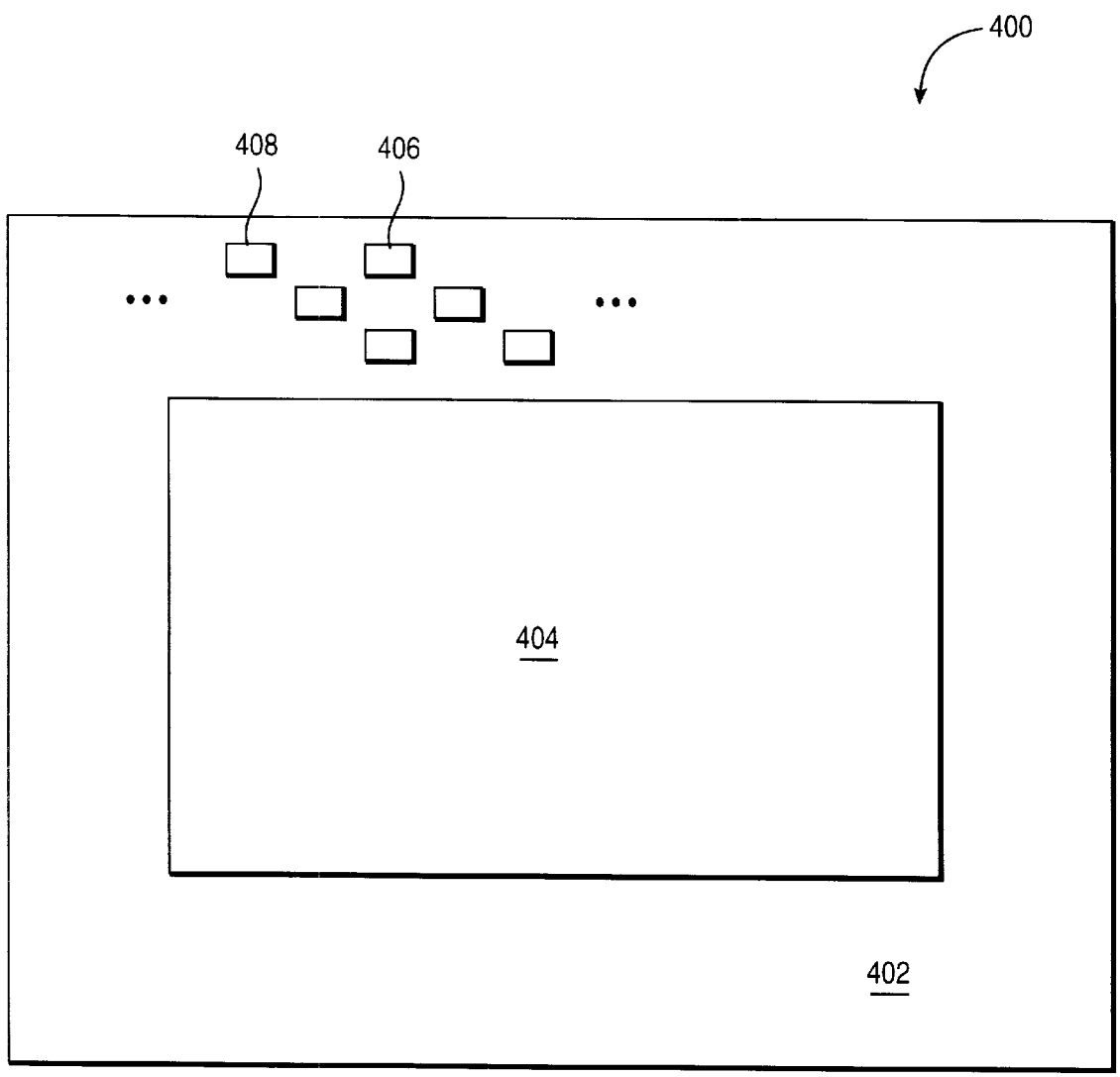
FIG. 4 shows a typical integrated circuit chip with the driver circuit.

FIG. 4 shows a typical integrated circuit chip with the driver circuit. IC 400 comprises a core circuitry 404 surrounded by I/O circuitry on the periphery 402 of the chip. The I/O circuitry comprises static discharge protection circuitry 406 and driver circuitry 408. Driver circuits like those of FIG. 1 would preferably be used for some (but not necessarily all) of the output drivers in driver circuitry 408.

According to a disclosed class of innovative embodiments, there is provided: An integrated bus interface driver circuit, comprising: a bipolar transistor connected to controllably drive an output terminal; and a feedback circuit, comprising one or more field-effect transistors connected to, under at least some circumstances, detect variation in the voltage of said output terminal, and accordingly vary the base current of said bipolar transistor to thereby vary the current applied by said bipolar transistor at said output terminal to oppose said variation in the voltage of said output terminal.

According to another disclosed-class of innovative embodiments, there is provided: An integrated bus driver circuit, comprising: an output driver subcircuit connected to controllably drive an output terminal; and first and second field-effect transistors, wherein said second transistor is biased near turn-on and controls said first transistor in dependence on the voltage of said output terminal; wherein a change in voltage at said output terminal relative to a reference voltage at a control terminal of said second transistor, causes said first transistor to conduct; wherein said first transistor varies the drive current applied to said output terminal by said output driver subcircuit, in a direction such that said output voltage returns toward an initial value.

According to another disclosed class of innovative embodiments, there is provided: An integrated circuit method for controlling a bus interface circuit, comprising the step of: controllably driving an output terminal with a bipolar transistor; wherein a feedback circuit comprising one or more field-effect transistors is connected to automatically vary the base current of said bipolar transistor, under at least some circumstances, to thereby vary the current applied by said bipolar transistor at said output terminal to oppose any variation in the voltage of said output terminal.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

The illustrated embodiment is a simple low-side driver configuration. However, of course a variety of port interface circuits can be combined with the circuitry shown. For example, an active pull-up circuit can also be used in combination with the driver circuit portion shown.

A complementary circuit configuration can also be used to limit static base current to a PNP high-side driver.

For example, as will be obvious to those of ordinary skill in the art, other circuit elements can be added to, or substituted into, the specific circuit topologies shown.

For another example, within the constraints well-known to those of ordinary skill, nonlinear devices can be added in series with (or used to replace) resistors, to increase the impedance of load devices.

For another example, within the constraints well-known to those of ordinary skill, a variety of well-known reference circuit configurations can be substituted for those shown.

For another example, within the constraints well-known to those of ordinary skill, components may be added to speed up the feedback circuit.

For another example, within the constraints well-known to those of ordinary skill, components may be added to switch off the whole circuit from its supply voltage, during a power-down event.

What is claimed is:

1. An integrated bus interface driver circuit having an output terminal, comprising:

a bipolar transistor connected to controllably drive said output terminal; and a feedback circuit including one or more field-effect transistors connected to detect variations in the voltage of said output terminal and to vary the base current of said bipolar transistor to thereby vary the current applied by said bipolar transistor at said output terminal to oppose said variation in the voltage of said output terminal;

wherein said feedback circuit comprises a base-drain-connected bipolar transistor between a gate of said one or more field-effect transistors and ground, and also comprises a Schottky diode between a source of said one or more field-effect transistors and said output terminal.

2. The integrated circuit of claim 1, wherein said bipolar transistor is NPN.

3. The integrated circuit of claim 1, wherein all of said field-effect transistors are n-channel devices.

4. The integrated circuit of claim 1, wherein said feedback circuit includes a delay-limiting path of field-effect transistors between said one or more field-effect transistors and said base of said bipolar transistor.

5. The integrated circuit of claim 1, wherein said feedback circuit is temperature compensated.

6. The integrated circuit of claim 1, wherein said feedback circuit further comprises one or more field-effect transistors to limit base current to said bipolar transistor, and another field-effect transistors of said one or more field-effect transistors to control a gate voltage of said one or more field-effect transistors and is connected to follow the voltage of said output terminal.

* * * * *